United States Patent

[11] 3,615,935

[72] Inventors Terence W. O'Keeffe
Pittsburgh;
Melvyn W. Larkin, Monroeville, both of Pa.
[21] Appl. No. 640,164
[22] Filed May 22, 1967
[45] Patented Oct. 26, 1971
[73] Assignee Westinghouse Electric Corporation
Pittsburgh, Pa.

[54] FABRICATION OF SEMICONDUCTOR DEVICES UTILIZING BOMBARDMENT-ENHANCED ETCHING OF INSULATING LAYERS
6 Claims, 3 Drawing Figs.

[52] U.S. Cl. .......... 148/187, 117/93.3, 156/17, 148/1.5, 204/164, 204/192
[51] Int. Cl. .......... H01l 7/54
[50] Field of Search .......... 148/1.5, 186, 187, 189; 204/164, 192; 156/17; 117/93.3

[56] References Cited

UNITED STATES PATENTS

| | | | |
|---|---|---|---|
| 2,902,583 | 9/1959 | Steigerwald | 148/1.5 UX |
| 3,205,087 | 9/1965 | Allen | 148/1.5 UX |
| 2,989,385 | 6/1961 | Glanola | 148/1.5 X |
| 3,226,611 | 12/1965 | Haenichen | 148/187 X |
| 3,434,894 | 3/1969 | Gale | 148/187 |

OTHER REFERENCES

Applicants' Non-Pat. Citations O' Keeffe, T. W. Enhanced Etching in Electron and Proton Bombarded Silicon Dioxide Layers. In Journal of Electrochemical Society. Vol. 112, 1965, p. 149C. TP250. A54j.

*Primary Examiner*—L. Dewayne Rutledge
*Assistant Examiner*—R. A. Lester
*Attorneys*—F. Shapoe, C. L. Menzemer and G. H. Telfer

ABSTRACT: A process for the fabrication of semiconductor devices is described utilizing an insulating layer such as silicon dioxide for diffusion masks and contact mask wherein openings in the insulating layer are produced by etching following selective bombardment with particles such as electrons without the use of conventional etch-resistant materials such as photoresists.

PATENTED OCT 26 1971

3,615,935

INVENTORS
Terence W. O'Keeffe
and Melvin W. Larkin
BY Gordon H Telfer
ATTORNEY

FABRICATION OF SEMICONDUCTOR DEVICES UTILIZING BOMBARDMENT-ENHANCED ETCHING OF INSULATING LAYERS

BACKGROUND OF THE INVENTION

1. Field of the Invention

This invention relates to semiconductor device fabrication utilizing selective diffusion through masks of insulating material.

2. Description of the Prior Art

Semiconductor devices such as transistors and integrated circuits are commonly fabricated in silicon using a mask of silicon dioxide for the selective diffusion of dopants. The practice is to open windows in the oxide layer by etching through holes in a photoresist mask. The photoresist operations for each diffusion require first applying the photoresist, exposing it through an optical mask, developing it, and removing it after the oxide etching is completed. Photoresist operations result in a relatively large part of fabrication costs.

There has been recently reported, Journal of the Electrochemical Society, Volume 112, page 149*c* (1965), a new phenomenon in an item entitled "Enhanced Etching in Electron and Proton Bombarded Silicon Dioxide Layers." That phenomenon has not previously been applied to the fabrication of semiconductor devices.

SUMMARY

This invention is a process for the fabrication of semiconductor devices through utilization of the enhanced etching rate of silicon dioxide due to particle bombardment. Photoresist operations are completely eliminated in forming oxide masks. There is first formed on the semiconductor device surface a silicon dioxide layer as by thermal oxidation. Utilizing a means for forming an electron or other particle pattern, such as a flood gun and shadow mask, the oxide layer is selectively bombarded with electrons having an energy sufficient to penetrate within the oxide layer and cause ionization therein. Preferably, the electron energy is in the range of from about 0.75° K. to about 1.25° K. for each 1,000 Angstroms of oxide layer thickness and the resulting magnitude of charge on the oxide layer is in the range from about 0.5 coulomb/cm.$^2$ to about 1.0 coulomb/cm.$^2$.

The oxide layer is then subjected to an etchant. A sharp difference in effect upon the bombarded and unbombarded areas of the oxide layers occurs in that the bombarded areas etch much more rapidly. It is preferred that the etchant be one containing nonbuffered hydrofluoric acid. The etching operation is continued for a period of time so that it completely removes the oxide from those portions of the surface which were bombarded with electrons while leaving in the remaining portions a layer having an appreciable thickness.

The structure is then subjected to impurity diffusion in a conventional manner. During or subsequent to the diffusion operation the oxide layer is reformed. An additional region in the first diffused region may be formed by a similar electron-bombardment operation and etching. Following the formation of the diffused regions, contact windows may be formed as necessary also utilizing electron bombardment and etching so that none of the semiconductor device structure requires the use of photoresist.

Application of contact elements to different device regions may be achieved in a conventional manner and may further include the use of electron beam exposure of photoresist material after a continuous conductive layer has been deposited on the surface to avoid all optical exposure steps in the fabrication process.

In carrying out the method in accordance with this invention it is found particularly important to control the energy of bombarding electrons and the charge density. The selection of an etchant and the initial oxide layer thickness are also important.

DESCRIPTION OF THE PREFERRED EMBODIMENTS

Figure 1:
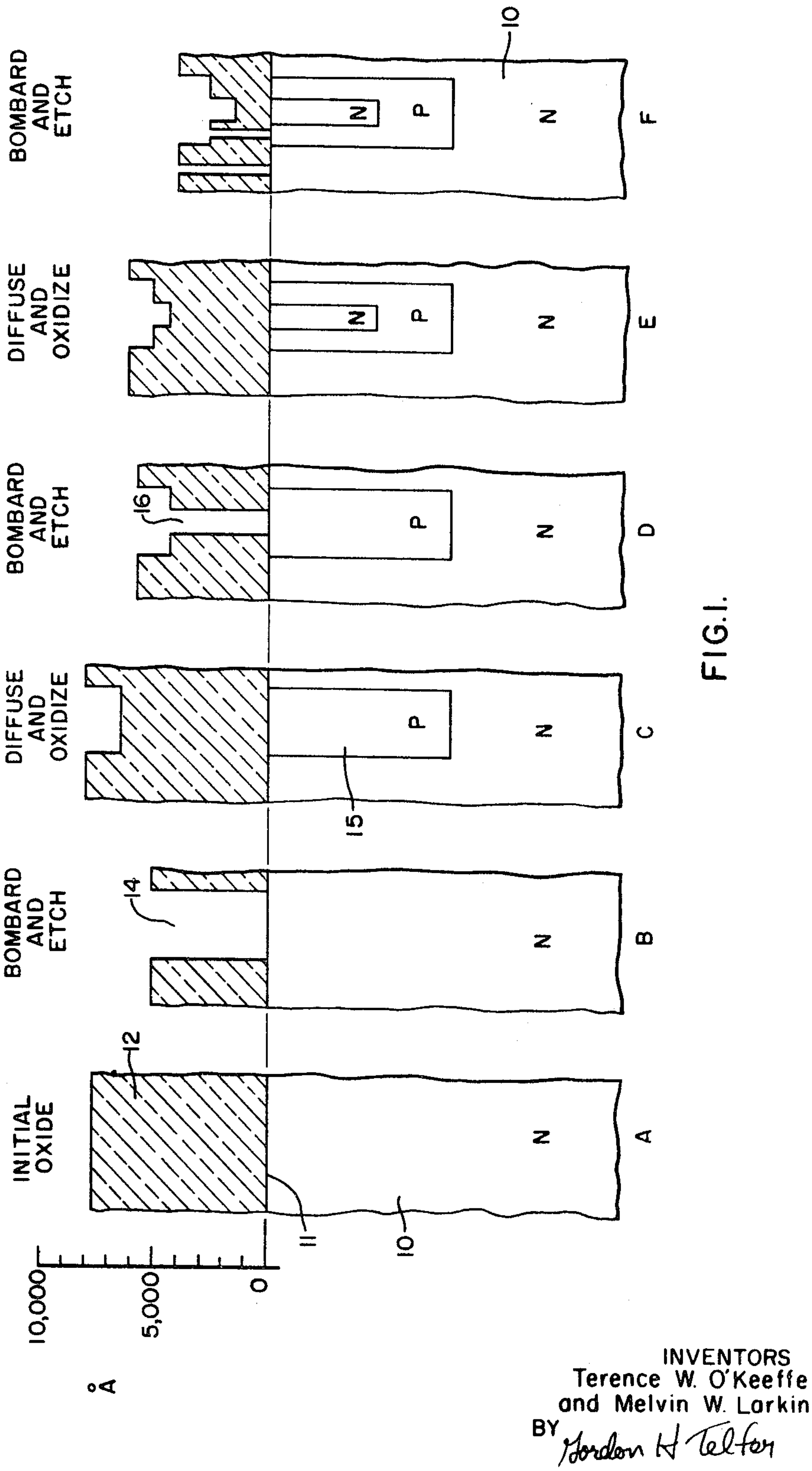
FIG. 1 is a composite, partial, cross-sectional view of a semiconductor structure at successive stages in the fabrication of transistors in accordance with this invention.

Referring to FIG. 1 a description of the present invention will be presented referring to transistor structures actually fabricated in silicon. As the starting material there was selected a body 10 of N-type monocrystalline silicon having a resistivity of about 2-ohm-centimeters with major surface dimensions of about 250 mils by 250 mils, an area used for the fabrication of 10 transistors. Ordinary commercially available device quality silicon was used. The major surface 11 was cleaned and chemically polished as is usual prior to formation of a thermal oxide layer thereon.

The choice of the starting body of silicon is not limited by this invention over what may be selected in accordance with prior art techniques utilizing oxide masking and photoresist techniques.

As shown in part A of FIG. 1, a layer 12 of silicon dioxide is thermally grown on the surface 11 to a thickness of about 8,000 Angstroms. Conventional oxide processes may be employed such as heating the body in a temperature of about 1,200° C. in an atmosphere that may include in sequence, dry, wet and dry oxygen.

As will be subsequently more apparent the selection of the initial oxide layer thickness, that it be not too great and not too thin, is important to the effectiveness of the process. In this example the starting layer 12 was formed having a thickness as is typically formed in a conventional photoresist process.

A window 14 through the oxide layer 12 for the diffusion of the base region is then formed to provide a structure as shown in part B of FIG. 1. For this purpose, the oxide layer 12 is bombarded with electrons in a precisely defined area as by the use of a shadow mask mounted approximately one thirty-second inch away from the oxide layer surface. It is also possible to employ a scanning electron beam to provide the required bombardment in the desired area.

The conditions of the electron bombardment are important. It has been found that the energy of bombarding electrons should be controlled so that they have an energy of from about ¾° K. to about 1¼° K. for each thousand Angstroms of silicon dioxide, at least when considering silicon dioxide layers up to about 15,000 Angstroms thickness. If the electron energy is below this range it is likely that the bombarding electrons will produce an effect only in the top portion of the silicon dioxide layer so that the differential in etching rate does not prevail through the entire layer thickness. If the energy of bombarding electrons is above this range, they are less efficient in producing ionization that is believed to cause the beam enhancement effect. Therefore, for an initial layer of thickness of 8,000 Angstroms it would be desirable that the bombarding electrons have an energy of from about 6° K. to about 10° K. In the experimental work conducted the typical electron energy was about 10° K.

Another factor of importance is the charge density applied to the oxide layer surface. It has been found in general desirable to produce a charge density of from about one-half coulomb per square centimeter to about 1 coulomb per square centimeter in the bombarded area. This charge density is important because a lesser charge density will produce an uneven effect, that is, the etching enhancement ratio is variable and increases up to this range of charge density. Past this range of charge density there is also some diminishing of the etch-enhancement ratio due, possibly, to thermal effects in the oxide layer.

Thermal effects require consideration during the electron bombardment because it has been found that an annealing step will erase the effect of the electron bombardment and return the oxide layer to its original condition. For this reason it is desirable that the silicon body be maintained at uniform low temperature subject only to necessary variations produced by the electron bombardment. The body may be temporarily mounted on a heat sink during bombardment as by utilizing a layer of a vacuum grease as the bonding medium. The heat sink may be maintained at room temperature or preferably at a lower temperature as by having it in contact with a quantity of liquid nitrogen.

Figure 2:
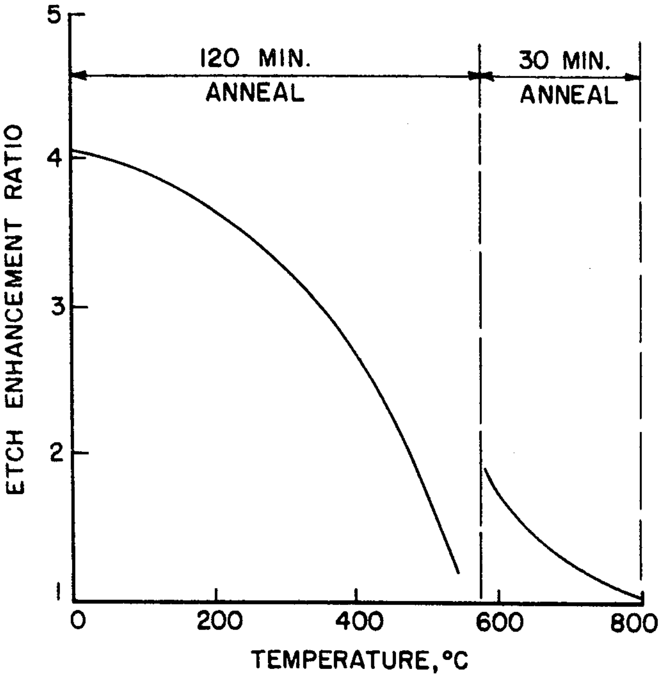
FIG. 2 is a graph illustrating data regarding temperature effects on the etch-enhancement ratio.

It is found that there is some reduction in the oxide layer thickness in those portions subjected to electron bombardment prior to etching. However, this condition is not an explanation for the difference in etching rate, because the thickness is reduced by only about 2 percent of the original layer thickness. This difference in thickness as well as other effects exhibited by the electron bombarded area are removed by annealing for a time and temperature as shown in FIG. 2 by way of example.

It is important to select carefully the etchant employed in the practice of this invention. Some known and widely used etchants such as ammonium bifluoride (a buffered hydrofluoric acid solution) provide an etch-enhancement ratio of about 2:1. A sodium hydroxide solution provides a maximum etch-enhancement ratio of about 1.7:1. By the etch-enhancement ratio is meant the relative speed of etching of electron bombarded areas to nonbombarded areas. Such low ratios are as 2:1 and 1.7:1 would be very difficult to use in a process requiring successive formation of a plurality of oxide masks. Much preferred are etchants which include nonbuffered hydrofluoric acid. Such etchants provide an etch-enhancement ratio of at least 3:1 or 4:1 for the electron-bombardment conditions expressed above. Examples of suitable etchants are concentrated hydrofluoric acid solution either by itself or with up to an equal amount by volume of concentrated nitric acid and up to 20 times as much by volume of water. (Standard acid concentrations are used.) In all such solutions the etch-enhancement ratio is found to be similarly high. The straight hydrofluoric acid solution provides a rapid etch and does not attack the underlying silicon but requires a fairly high degree of control to prevent too rapid etching in unbombarded areas. A quantity of water (1 to 20 parts by volume) slows down the etching action. The addition of nitric acid is not necessary, but has been found in some cases to improve the etch-enhancement ratio of dilute hydrofluoric acid solution.

Following the opening of a window for base diffusion by beam enhanced etching the oxide layer appears as shown in part B, where the bombarded portion has been entirely removed while the unbombarded portion has been reduced in thickness form about 8,000 Angstroms to about 5,000 Angstroms. The 5,000 Angstrom-thick layer provides an effective diffusion mask for diffusion of a boron containing impurity to produce a P-type diffused region 15 as shown in part C of FIG. 1. The deposition and diffusion of impurities in accordance with this invention may be performed as in the past wherein masks are formed by photolithographic techniques. In keeping with such practices, during the redistribution of impurities an oxidizing agent is provided in the atmosphere so that the oxide layer is reformed over the diffused region. This results in the oxide layer profile as shown in part C where over the diffused region the layer has been increased in thickness from 0 to about 6,500 Angstroms and over the remaining portion from about 5,000 to about 8,000 Angstroms, since such regrowth is not linear and depends on the present layer thickness.

The process is now repeated in a second electron bombardment and etching sequence to produce another opening 16 in the oxide layer within the first diffused region 15 as shown in part D of the Figure. By conventional diffusion techniques an emitter region 17 is diffused using a phosphorus impurity source, into the previously diffused base region. In the specific examples on which experimental studies were performed the base region was diffused to a sheet resistivity of about 240 ohms per square and a junction depth of about 4 microns while the emitter was diffused to a sheet resistivity of about 3.4 ohms per square and a junction depth of about 2.6 microns.

During the diffusion of the emitter region the surface is reoxidized to produce the oxide layer profile illustrated in part E of the Figure. Then a third electron bombardment and etching sequence is carried out to produce windows in the oxide layer for the disposition of contacts on each of the regions of the device. This is the most critical operation insofar as the oxide layer thickness is concerned. It is necessary that the nonbombarded layer portion covering the emitter junction be retained following etching but that the beam-enhancement effect be sufficient to completely remove the oxide layer through the thickest portion for the collector contact window. This is possible in accordance with this invention because of utilization of etch-enhancement ratios of about 3:1 or 4:1, although this ratio is influenced by the fact that inherently an oxide layer has a higher etching rate where it is doped as a consequence of the diffusion operations. Therefore some additional margin of safely has to be provided. The thinnest part of the oxide layer in the final structure, that is over the emitter junction, requires a certain thickness for passivation, typically a minimum of about 2,000 Angstroms. Generally speaking the thickest part of the oxide layer prior to the formation of the contact mask should be no more than about three times that minimum thickness and the original oxide layer should be no more than about four times that minimum layer thickness or there may be difficulty in securing the necessary window openings without removing the oxide layer over the emitter junction.

While generally less preferred, the beam-enhanced etching method in accordance with this invention may be used after completely stripping a previous oxide mask and forming an entirely new layer of more convenient and uniform thickness.

Figure 3:
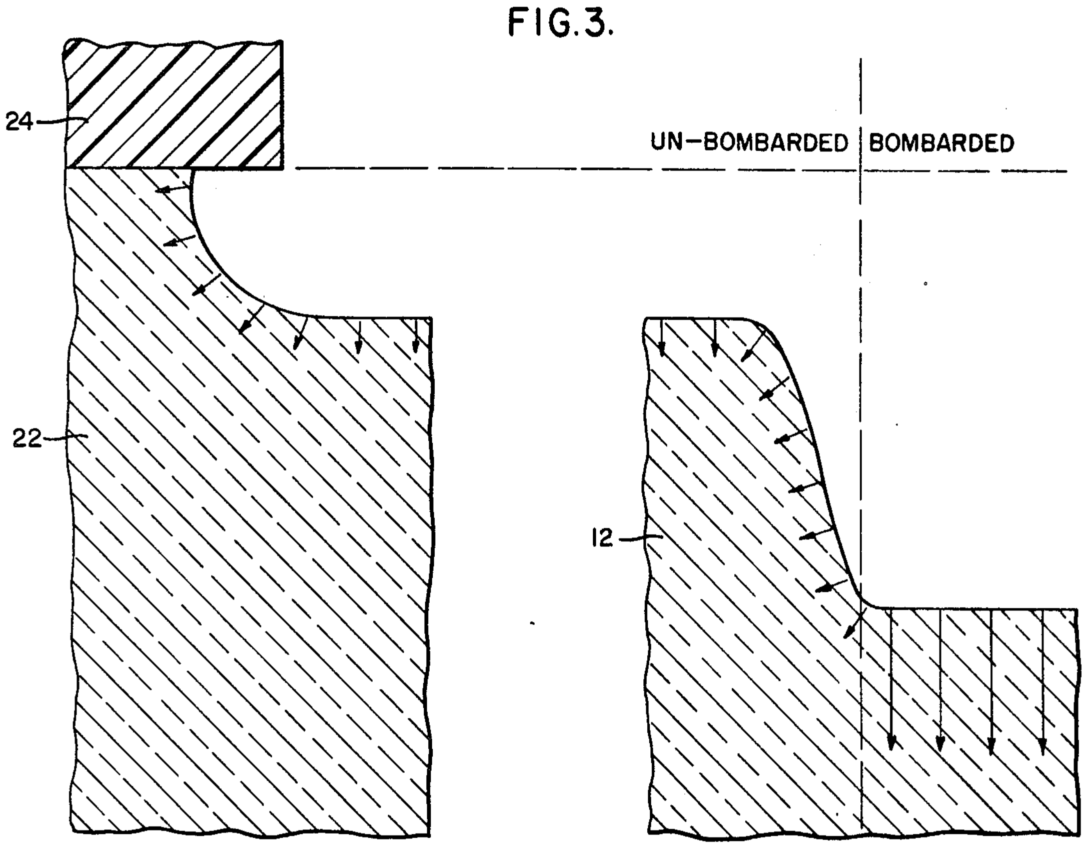
FIG. 3 is a partial sectional view of a silicon dioxide layer illustrating the difference in rate of etching the profile of etched material formed in the practice of this invention compared with that resulting from the use of photoresist materials.

FIG. 3 of the drawing illustrates the nature of the profile of the oxide layer in greater detail, and compares it with that which occurs in the practice of the prior art employing photolithography. In the left portion of the Figure, there is illustrated an oxide layer 22 with a photoresist mask 24 disposed thereon. Upon application of an etchant to the surface the etchant proceeds transversely through the oxide layer 22 and also laterally under the photoresist 24 at substantially equal rates with obvious deterioration of the resolution of the structure compared with that of the original photoresist mask. The arrow lengths indicate the rate of etching. This effect is minimized in the practice of this invention. This is because during the etching process the lateral etching rate is small compared with that of the transverse etching rate, and shown in the right-hand portion of the Figure for bombarded and unbombarded portions of oxide layer 12. It is therefore seen that in accordance with this invention a sharper definition of openings in a silicon dioxide layer may be produced. In general the resolution of openings in accordance with this invention is limited only by the ability to make sharply defined electrons patterns.

A layer of silicon dioxide may be electron bombarded by a scanning beam in an overlapping pattern as another manner in which the area to be opened may be defined besides the use of a shadow mask or bombarding only in the specific area in which a window is desired. If the beam is applied with a half dosage rate in two transverse paths then the surface is etched for a suitable time, the oxide layer will only be entirely removed at their intersection where the dosage equals that required to produce sufficient enhancement of the etching rate.

Use of either flood guns with shadow masks or a scanning electron beam entail certain difficulties that indicate the desirability of an alternative way to form the election bombardment pattern.

Resolution obtainable with convention photoresist processing is of the order of 3 microns. Such resolution is well within the capability of a scanning electron beam such as in commercially available scanning electron microscopes where beam sizes of 0.1 micron can be easily obtained and resolutions of 0.5 micron have been demonstrated. However, the current available in such beams is only, at best, $10^{19}$ amperes which, if applied to scan an area of 1 cm.$^2$ would take on the order of $10^9$ sec. to provide necessary charge density.

On the other hand, a flood gun readily supplies necessary beam current but is more limited in resolution. The shadow mask required for such a system is not easily and cheaply made with high resolution (say 3 microns). Also, the pattern choice is limited because islands (e.g., the mask area circumscribed by an annular opening) cannot be readily supported.

Resolution can be improved in a flood gun-mask scheme by suing a larger mask than the workpiece with openings of easily achieved resolution (10–15 microns.) An electron-optics system can provide demagnification to give the desired resolution. Also, greater flexibility in the choice of patterns could be provided by multiple bombardment through conjugate masks. For example, one C-shaped portion of an annulus could be provided in one mask and a mating C-shaped portion in another.

An alternate electron source is a photocathode. The required optical pattern, of any configuration, may be projected onto the photocathode forming a corresponding electron image. Also, a photocathode of the specifically desired pattern may be used. The electron image is projected, using suitable electron optics, onto the workpiece. The arrangement is similar to conventional image intensifiers with the workpiece in the place of the usual phosphor output screen.

Since present conventional photocathodes are limited to current densities of the order of 10 microamperes per cm.$^2$ an increase to a more workable level of 1 milliampere per cm.$^2$ may be provided either by demagnification of the original electron image or using electron multiplier stages.

At present there are available demagnifying, electrostatically focused image tubes that attain a resolution of 80-line-pairs per mm. (or 6 microns) on a phosphor screen. It is expected an improvement by about a factor of two would be provided by the electron optics itself since some loss of resolution must be attributed to the phosphor. The required energy of about 10° K. is well suited to image tube capabilites.

In such a pattern generating scheme, the ability to align the pattern with existing patterns on the workpiece is important. This may be done by use of an auxiliary scanning electron beam using either the change in secondary emission from charged areas of the oxide layer or the variation in the capacitor discharge current to the underlying silicon (or both) which would provide a signal viewable on a cathode-ray tube. Such a scanning beam, because of its limited current, would not produce any significant effect on the oxide layer and, furthermore, only indexing marks of limited area need be exposed. Also the electron charge pattern could be displayed prior to significantly charging the oxide layer to allow final alignment of the pattern.

Some experimental work has been performed to study the effect of electron bombardment on the etching rate of silicon dioxide layers formed by techniques other than thermal oxidation, namely by the well-known techniques of pyrolytic deposition and by anodization. Also some study of the effect on deposited layers of silicon oxide formed by evaporation from a silicon monoxide source. Using similar energy and charge density as for the thermal silicon dioxide layers it is found that the effect of the bombardment is the reverse. That is, the etching rate of the bombarded areas is retarded compared with that of the unbombarded areas. The ratio of retardation is similar to the enhancement ratio occuring in silicon dioxide. It is possible to open window in such a layer by bombarding everywhere except where the windows are desired.

The difference in effect between different silicon oxide layers may be due to difference in density of the different layers. In general, layers of silicon dioxide produced by thermal oxidation are reported to have a density within the range of from about 2.18 g./cm.$^3$ to about 2.21 g./cm.$^3$ while pyrolytic oxide has a density of about 2.14 g./cm.$^3$. Layers of pyrolytic oxide may be densified to within the density range for thermal oxide. A layer deposited from a silicon monoxide source may also be densified.

Such densification may occur due to heating in the range of about 1,000° C. to about 1,400° C. The heating may be provided by a conventional furnace or by other means such as electron bombardment itself (e.g. in the absence of a heat sink). Thus, the practice of the invention is not limited to thermally oxidized silicon for etch enhancement and the substrate may be of a material different than silicon.

Etch enhancement effects have also been observed using particle bombardment by other than electrons. In general, any damaging radiation that produces either ionization or atomic displacement damage, or both, such as electrons, ions, protons, neutrons, X-rays, gamma rays, and ultraviolet rays may be used. For example, an etch enhancement ratio of about 11 to 1 has been observed as a result of bombardment of thermally grown silicon dioxide with 100° K. protons.

The practice of the present invention does not depend on mere disturbance in the crystalline orientation of the bombarded areas because thermally grown silicon dioxide layers are highly amorphous. The effect in such material with electrons at relatively low-energy levels (¾° to 1¼° K. per 1,000 Angstroms) shows that it is due to ionization rather than atomic displacement. Atomic displacement, with heavier or more highly energetic particles, is a distinctly different mechanism and probably less susceptible to the degree of control necessary for successful device fabrication.

While the present invention has been shown and described in a few forms only, it will be apparent that many changes and modifications may be made without departing from the spirit and scope thereof.

We claim:

1. In a method of fabricating a semiconductor device, the steps comprising: forming a layer of insulating material on a surface of a body of semiconductor material, said layer of insulating material comprising at least one oxide of silicon selected from the group consisting of silicon dioxide and silicon monoxide and having a density up to about 2.14 g./cm.$^3$; selectively bombarding said layer with damaging radiation; subjecting said layer after bombarding to an etchant to remove said layer in at least a first portion and to leave remaining at least a second portion, said portions being defined by the pattern of bombarding radiation and said first portion being that portion that is not bombarded by damaging radiation.

2. The method of claim 1 in which said layer comprises silicon dioxide formed by deposition on said body.

3. In a method of fabricating a semiconductor device, the steps comprising: forming a layer of thermally grown silicon dioxide on a surface of a body of semiconductor material; selectively bombarding said layer with electrons to provide a charge density on at least a first portion of said layer of from about 0.5 to 1.0 coulomb per square centimeter subjecting said layer after bombarding to an etchant to remove said layer in at least the first portion and to leave remaining at least a second portion, said portions being defined by the pattern of bombarding radiation.

4. In a method of fabricating a semiconductor device, the steps comprising: forming a layer of insulating material on a surface of a body of semiconductor material, said layer of insulating material comprising at least one oxide of silicon selected from the group consisting of silicon dioxide and silicon monoxide and having a density within the range of at least about 2.18 g./cm$^3$; selectively bombarding said layer with electrons having an energy of from about 0.75° K. to about 1.25° K. for each thousand angstroms of oxide layer to provide a charge density on at least a first portion of the layer of from about one-half coulomb per square centimeter to about 1 coulomb per square centimeter subjecting said layer after bombarding to an etchant to remove said layer in at least a first portion and to leave remaining at least a second portion, said portions being defined by the pattern of bombarding radiation.

5. In a method of fabricating a semiconductor device, the steps comprising: forming a layer of insulating material on a surface of a body of semiconductor material; selectively bombarding said layer with electrons to provide a charge density on at least a first portion of said layer of from about one-half to about 1 coulomb per square centimeter, said electrons being produced by an electron beam controllably scanned over said layer; subjecting said layer after bombarding to an etchant to remove said layer in at least the first portion and to leave remaining at least a second portion, said portions being defined by the pattern of bombarding radiation.

6. In a method of fabricating a semiconductor device, the steps comprising:

thermally oxidizing a surface of a body of monocrystalline silicon to form a layer of silicon dioxide thereon of a uniform first thickness;

selectively bombarding said silicon dioxide layer with electrons with an energy of from about $\frac{3}{4}$° to $1\frac{1}{4}$° K. for each 1,000 Angstroms of said silicon dioxide layer and in sufficient number to provide a charge density on said layer of from about one-half to 1 coulomb per square centimeter;

subjecting said layer after bombarding without an etch resistant mask, to an etchant that etches said first portion at a faster rate than at least a second portion of said layer not bombarded by said electrons, said second portion surrounding said first portion;

permitting etching to continue until said first portion of said layer is removed and said second portion is reduced in thickness to a second thickness;

diffusing an impurity through said first window into said body to form a first N-junction therein;

reforming by thermal oxidation, said layer to provide a third thickness in the location of said first opening, said second thickness being increased and being greater than said third thickness;

selectively bombarding said silicon dioxide layer a second time with electrons of an energy to produce ionization within at least a third portion of said layer that is of said third thickness;

subjecting said layer after bombarding said second time, without an etch-resistant mask, to said etchant, and permitting etching to continue until said third portion of said layer is removed and a fourth portion surrounding said third portion and not bombarded is reduced in thickness to a fourth thickness to define a second window through said layer.

* * * * *